United States Patent [19]

Kuroda

[11] Patent Number: 5,742,183
[45] Date of Patent: Apr. 21, 1998

[54] LEVEL SHIFT SEMICONDUCTOR DEVICE

[75] Inventor: Tadahiro Kuroda, Yokohama, Japan

[73] Assignee: Kabushiki Kaisha Toshiba, Tokyo, Japan

[21] Appl. No.: 702,924

[22] Filed: Aug. 26, 1996

[30] Foreign Application Priority Data

Aug. 25, 1995 [JP] Japan .................... 7-217636

[51] Int. Cl.$^6$ .................................. H03K 19/0185
[52] U.S. Cl. .................. 326/81; 326/68; 326/80
[58] Field of Search ................... 326/21, 63, 68, 326/80, 81, 83, 121

[56] References Cited

U.S. PATENT DOCUMENTS

| | | | |
|---|---|---|---|
| 4,574,273 | 3/1986 | Atsumi et al. | 326/80 X |
| 4,656,373 | 4/1987 | Plus | 326/81 |
| 4,926,070 | 5/1990 | Tanaka et al. | 326/81 |
| 4,958,091 | 9/1990 | Roberts | 326/81 |
| 5,115,434 | 5/1992 | Aizaki | 326/81 |
| 5,416,368 | 5/1995 | Sugibayashi | 326/68 |
| 5,666,070 | 9/1997 | Merritt et al. | 326/80 X |

*Primary Examiner*—David R. Hudspeth
*Attorney, Agent, or Firm*—Loeb & Loeb LLP

[57] ABSTRACT

A level shift semiconductor device converts a signal level into another level between circuits connected to each other having different supply voltages. An input signal is supplied to the source of a first MOS transistor of a first-conductivity type (NMOS). The drain of the 1st NMOS transistor is connected to the input terminal of an inverter. An output signal is outputted via the output terminal of the inverter. The drain and gate of a first MOS transistor of a second-conductivity type (PMOS) are connected to the input and output terminals of the inverter, respectively. The gate and source of a second NMOS transistor are connected to the output terminal of the inverter and the gate of the 1st NMOS transistor, respectively. The gate and source of a second PMOS transistor are connected to the gate and source of the 2nd NMOS transistor. A first supply voltage is supplied to the drain of the 2nd PMOS transistor. And, a second supply voltage is supplied to the inverter, the source of the 1st PMOS transistor, and the drain of the 2nd NMOS transistor. The second voltage is larger in absolute value than the first voltage.

7 Claims, 10 Drawing Sheets

LEVEL SHIFT SEMICONDUCTOR DEVICE

BACKGROUND OF THE INVENTION

The present invention relates to a semiconductor device. More specifically, this invention relates to a level shift semiconductor device for converting a signal level into another signal level between circuits connected to each other and having different supply voltages.

Figure 1A:
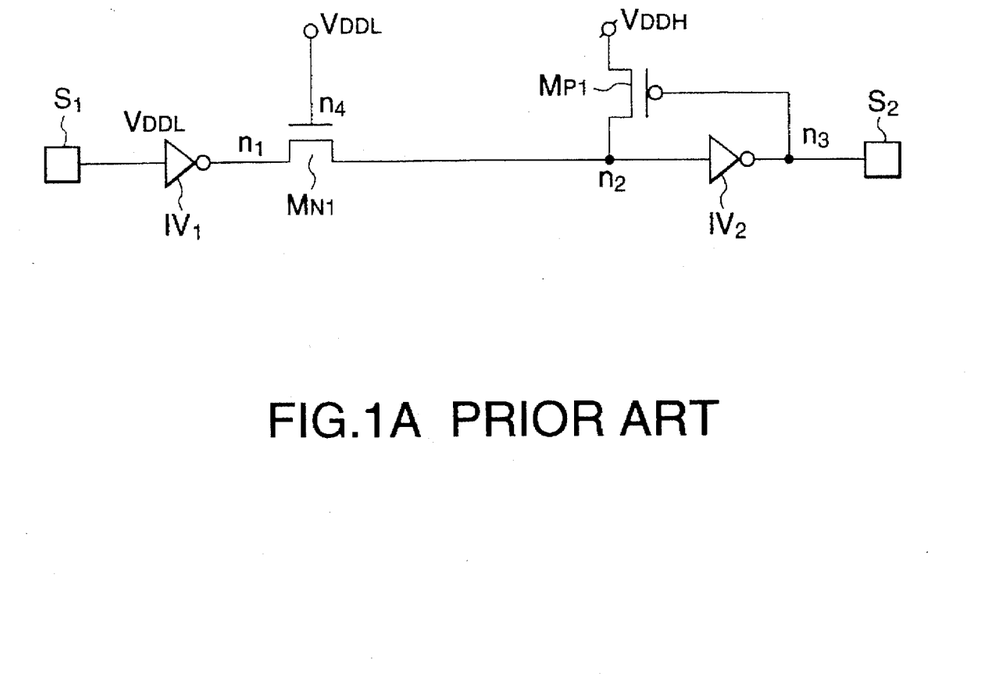
FIG. 1A is a circuit diagram of a conventional level shift semiconductor device.
Figure 1B:
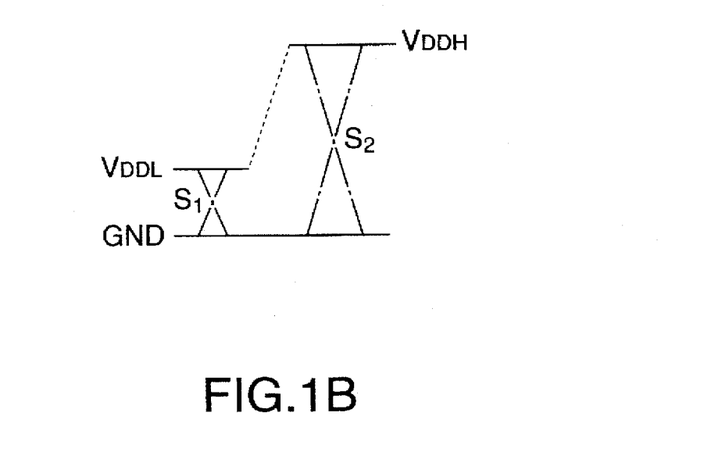
FIG. 1B shows the voltage level change of the semiconductor device shown in FIG. 1A.

A conventional level shift semiconductor device incorporated in a semiconductor integrated circuit device is shown in FIG. 1A. This circuit shifts a level of a logical signal changing between a first supply voltage $V_{DDL}$ and a ground GND into another level of a second logical signal changing between a second supply voltage $V_{DDL}$ higher than the first supply voltage $V_{DDL}$ and the ground GND, as shown in FIG. 1B.

The level shift circuit shown in FIG. 1A includes inverters $IV_1$ and $IV_2$, an N-channel MOS transistor $MN_{N1}$, and a P-channel MOS transistor $M_{P1}$.

The operation of this circuit will be described hereinbelow. Here, the assumption is made that the supply voltage $V_{DDL}$ is 1.5V; the supply voltage $V_{DDH}$ is 3V; and the threshold level of the NMOS transistor $V_{th}$ is 0.5V.

When an "H" level signal (=1.5V) is applied to an input terminal $S_1$, a node $n_1$ is set to an "L" level (=0V) by the inverter $IV_1$. Since the supply voltage $V_{DDL}$ (=1.5V) is kept applied to the gate of the NMOS transistor $M_{N1}$, the transistor $M_{N1}$ is turned on to discharge a charge at a node $n_2$, so that the node $n_2$ changes to the "L" level (=0V). Further, a node $n_3$ changes to the "H" level (=3V) by the inverter $IV_2$ whose input is an input node $n_2$. As a result, the "H" level input signal with an amplitude $V_{DDL}$ can be level-shifted to the "H" output signal with an amplitude $V_{DDH}$, and then outputted from an output terminal $S_2$. The PMOS transistor $M_{p1}$ is then turned off.

On the other hand, when an "L" level signal (=0V) is applied to the input terminal $S_1$, the node $n_1$ is set to the "H" level (=1.5V) by the inverter $IV_1$. Since the supply voltage $V_{DDL}$ (=1.5V) is kept applied to the gate of the NMOS transistor $M_{N1}$, the node $n_2$ is charged up to "H"–$V_{thn}$ (=1.0V) before the transistor $M_{N1}$ is turned off. Here, when the threshold level of the inverter $IV_2$ is set to a voltage lower than 1V, since the input to the inverter $IV_2$ changes to the "H" level, the node $n_3$ changes to the "L" level (=0V). This "L" level is applied to the output terminal $S_2$ and the gate of the PMOS transistor $M_{p1}$. The PMOS transistor $M_{p1}$ is then turned on to pull up the node $n_2$ to $V_{DDH}$ (=3V). This pulled-up potential at the node $n_2$ prevents the voltage level applied to the input terminal of the inverter $IV_2$ from being kept at an input level for current flow through the inverter $IV_2$. Under these conditions, the source of the NMOS transistor $M_{N1}$ is the node $n_1$. Here, since the gate-source voltage of $M_{N1}$ is lower than $V_{thn}$, the transistor $M_{N1}$ is kept turned off, so that the potential at the node $n_1$ cannot be charged beyond $V_{DDL}$.

This conventional level shift semiconductor device, however, has the following drawbacks:

When the "L" level signal is propagated, the node $n_2$ is charged from the "L" level to "H–$V_{thn}$" by the transistor $M_{N1}$. In this case, since the input to the inverter $IV_2$ is fairly lower than $V_{DDH}$, a relatively large dc current (through current) flows through the inverter $IV_2$, with the result that a power loss increases inevitably.

In addition, since the "H" level at the node $n_2$ drops from the supply voltage $V_{DDL}$ by $V_{thn}$ of the transistor $M_{N1}$, it is necessary to set the threshold level of the inverter $IV_2$ to a relatively low level, with the result that a delay time required to shift the signal level is lengthened.

In other words, when the supply voltage $V_{DDL}$ drops, since the potential at the node $n_2$ cannot increase beyond the threshold level of the inverter $IV_2$, there exists a problem in that the "L" input signal cannot be propagated or the operation margin is too small.

Figure 2:
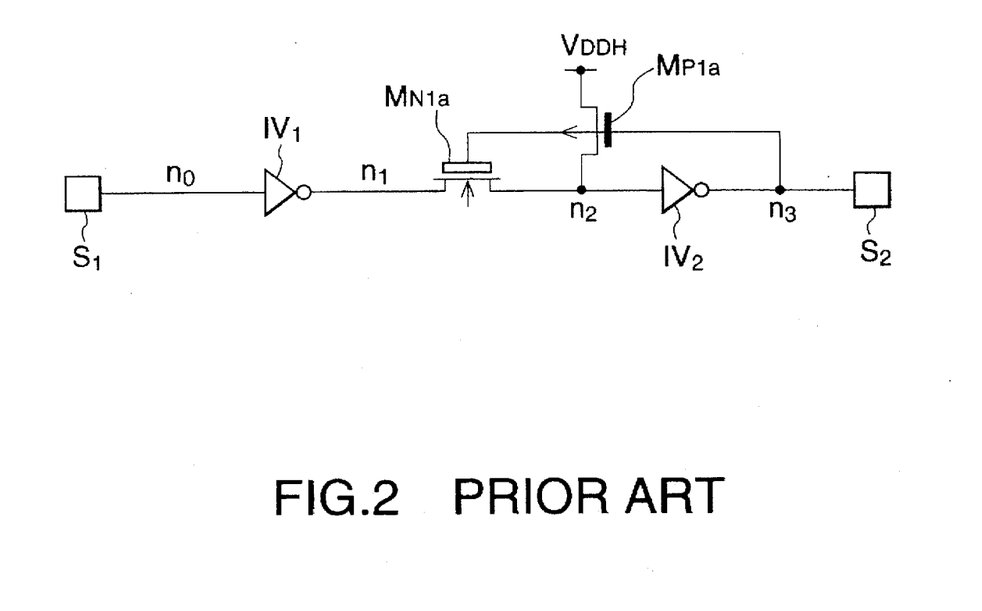
FIG. 2 is a circuit diagram of another conventional level shift semiconductor device.

To overcome these problems, Japanese Laid-Open Patent No. 2(1990)-134918 discloses a level shift circuit as shown in FIG. 2.

The difference between the circuits in FIGS. 1A and 2 is that the circuit of FIG. 2 includes an N-channel D(depletion)-type MOS transistor $MN_{N1a}$ whose gate is connected to the gate of a P-channel E(enhancement)-type MOS transistor $M_{P1a}$.

The operation of this circuit shown in FIG. 2 will be described hereinbelow:

When the voltage applied to the input terminal $S_1$ changes from $V_{DDL}$ to the ground GND, the voltage at the node $n_0$ changes from $V_{DDL}$ to GND. The voltage a the node $n_1$ then changes from GND to $V_{DDL}$ by the inverter $IV_1$. The cut-off transistor $M_{N1a}$ of D-type is turned on to charge the node $n_2$ up to about $V_{DDL}$. When the voltage at the node $n_2$ increases beyond the threshold level of the inverter $IV_2$, the voltage at the node $n_3$ changes from $V_{DDL}$ to GND. The GND level of the node $n_3$ turns on the feedback transistor $M_{P1a}$ to charge node $n_2$ up to $V_{DDH}$. This results in no charge current flow through the inverter $IV_2$. Further, the gate potential of the cut-off transistor $M_{N1a}$ decreases with decreasing potential at the node $n_3$. The transistor $M_{N1a}$ is turned off when this gate potential decreases below the threshold voltage $V_{thn}$. Current flow from the high voltage circuit to the low voltage circuit is then cut off. The voltage at the node $n_2$ can be held at $V_{DDH}$ by the transistor $M_{P1a}$ after the transistor $M_{N1a}$ is turned off.

When the "L" level signal is propagated by this level shift circuit, since the node $n_2$ can be charged up to roughly $V_{DDL}$ by the transistor $M_{N1a}$, even if $V_{DDL}$ is low, it is possible to propagate the signal of the low voltage circuit to the high voltage circuit.

Next, when the voltage applied to the input terminal $S_1$ changes from the ground GND to $V_{DDL}$, the voltage at the node $n_0$ changes from GND to $V_{DDL}$. The voltage at the node $n_1$ then changes from $V_{DDL}$ to GND by the inverter $IV_1$. The cut-off transistor $MN_{N1a}$ is turned according to a change of the voltage at the node $n_1$. Here, the feedback transistor $M_{P1a}$ is also turned on. The voltage at the node $n_2$ then drops to a level determined on the basis of the turn-on resistance of the transistor $M_{N1a}$ and that of the transistor $M_{P1a}$. When the voltage at the node $n_2$ drops below the threshold level of the inventer $IV_2$, the voltage at the node $n_3$ changes from GND to $V_{DDH}$. This causes the feedback transistor $M_{P1a}$ to be turned off. The voltage at the node $n_2$ then drops to GND via cut-off transistor $M_{N1a}$, so that no dc current flows through the inverter $IV_2$.

In the conventional level shift circuit as shown in FIG. 2, however, the gate potential of the cut-off transistor $M_{N1a}$ depends on the potential of the node $n_3$. Therefore, a delay time required to shift the signal level is not so shortened. Further, the circuit of FIG. 2 includes both the depletion and enhancement-type transistors. This results in a complicated manufacturing process.

SUMMARY OF THE INVENTION

Accordingly, it is the object of the present invention to provide a level shift semiconductor device, which can decrease the power loss and delay time both required to shift the signal level and increase the operation margin.

To achieve the above-mentioned object, the present invention provides a level shift semiconductor device, comprising: a first MOS transistor of a first-conductivity type having a source supplied with an input signal; an inverter having an input terminal connected to a drain of the first MOS transistor of the first-conductivity type and an output terminal for outputting an output signal; a first MOS transistor of a second-conductivity type having a drain connected to the input terminal of the inverter and a gate connected to the output terminal of the inverter, the second conductivity type being opposite of the first conductivity type; a second MOS transistor of the first-conductivity type having a gate connected to the output terminal of the inverter and a source connected to a gate of the first MOS transistor of the first-conductivity type; a second MOS transistor of the second-conductivity type having a gate connected to the gate of the second MOS transistor of the first-conductivity type and a source connected to the source of the second MOS transistor of the first-conductivity type; a first voltage supply for supplying a first supply voltage to a drain of the second MOS transistor of the second-conductivity type; and a second voltage supply for supplying a second voltage to the inverter, a source of the first MOS transistor of the second-conductivity type, and a drain of the second MOS transistor of the first-conductivity type, the second voltage being larger in absolute value than the first voltage.

Further, the present invention provides a level shift semiconductor device, comprising: a first-conductivity type MOS transistor having a source supplied with an input signal; an inverter having an input terminal connected to a drain of the first-conductivity type MOS transistor and an output terminal for outputting an output signal; a second-conductivity type MOS transistor having a drain connected to the input terminal of the inverter and a gate connected to the output terminal of the inverter, the second conductivity type being opposite of the first-conductivity type; a bias circuit for applying a first voltage obtained by adding a maximum voltage of the input signal and a threshold voltage of the first-conductivity type MOS transistor, to a gate of the first-conductivity type MOS transistor; and a voltage supply for supplying a second voltage to a source of the second-conductivity type MOS transistor and the inverter, the second voltage being larger in absolute value than the maximum voltage of the input signal.

DETAILED DESCRIPTION OF THE PREFERRED EMBODIMENTS

Embodiments of the level shift semiconductor device according to the present invention will be described hereinbelow with reference to the attached drawings.

A first embodiment of the semiconductor device according to the present invention will be described hereinbelow with reference to FIGS. 3A and 3B. The same reference numerals have been retained in FIGS. 3A and 3B for similar parts and voltages having the same function as with the case of the prior art semiconductor device shown in FIGS. 1A and 1B.

In the first and other embodiments, all the transistors are of enhancement type. Here, in general, the threshold levels of MOS transistors differ according to the manufacturing process, and further there exists such a tendency that the threshold levels are determined to be lower gradually with decreasing supply voltage. Herein, however, the description will be made on assumption that the threshold level $V_{thn}$ of the NMOS transistor is 0.5V and the threshold level $V_{thp}$ of the PMOS transistor is −0.5V, respectively for convenience.

Figures 3A, 3B:
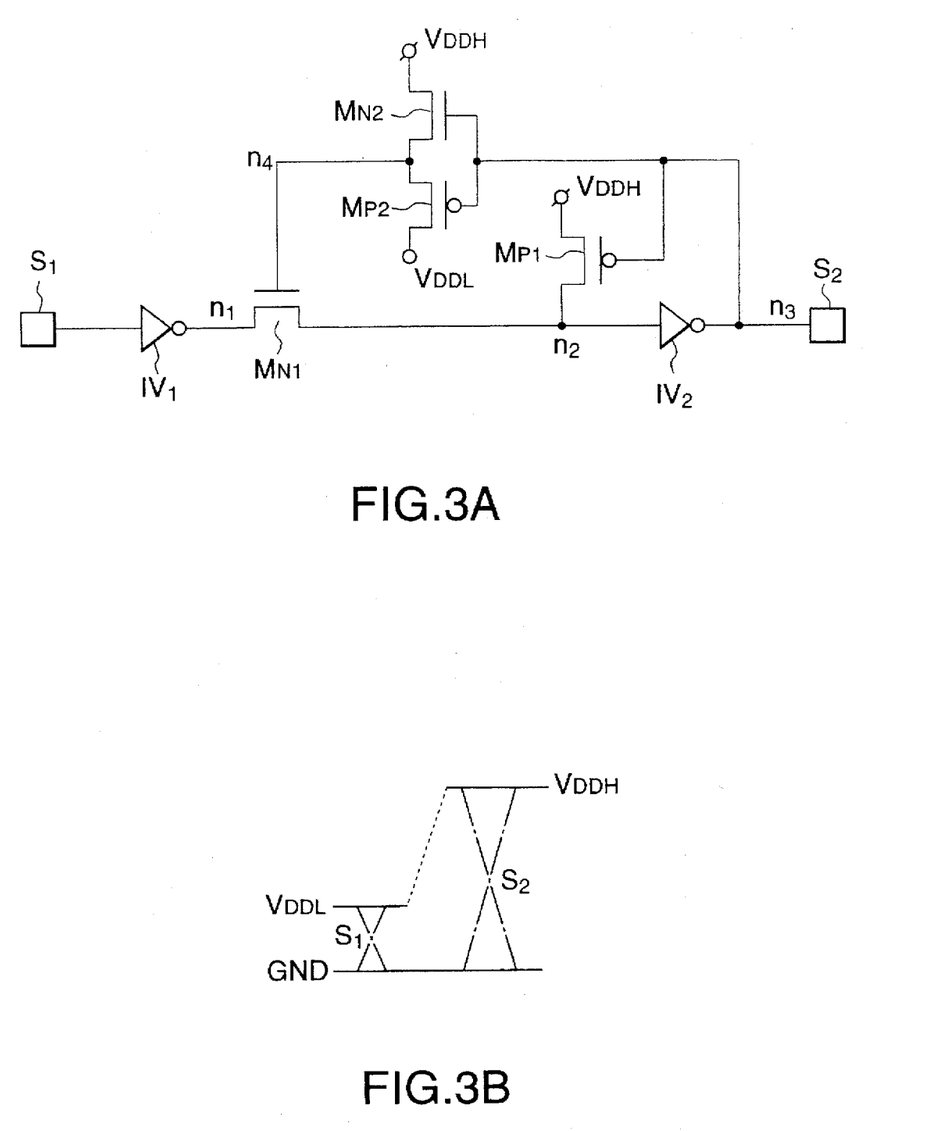
FIG. 3A is a circuit diagram showing a first embodiment of the level shift semiconductor device according to the present invention.
FIG. 3B shows the voltage level change of the semiconductor device shown in FIG. 3A.

In the circuit shown in FIG. 3A, two inverters $IV_1$ and $IV_2$ are constructed by a well-known CMOS transistor circuit of a PMOS and an NMOS transistor (both not shown). Two gates of the PMOS NMOS transistors are connected to each other. Their drains are also connected to each other. A source of the PMOS transistor of the inverter $IV_1$ is connected to the supply voltage $V_{DDL}$ and a source of the NMOS transistor of the inverter $IV_1$ is connected to the ground GND (0V). Further, a source of the PMOS transistor of the inverter $IV_2$ is connected to the supply voltage $V_{DDH}$ and a source of the NMOS transistor of the inverter $IV_2$ is connected to the ground GND (0V).

Further, in the circuit shown in FIG. 3A, an NMOS transistor $M_{N2}$ and a PMOS transistor $M_{P2}$ are connected between the node $n_3$ and the gate (i.e., a node $n_4$) of an NMOS transistor $M_{N1}$. The gates of both the transistors $M_{N2}$ and $M_{P2}$ are connected in common to the node $n_3$ and also to the gate of a PMOS transistor the $M_{P1}$. The sources of the transistors $M_{N2}$ and $M_{P2}$ are connected in common to the node $n_4$. Further, the drain of the transistor $M_{N2}$ is connected to the supply voltage $V_{DDH}$, and the drain of the transistor $M_{P2}$ is connected to the supply voltage $V_{DDL}$.

Owing to the two transistors $M_{N2}$ and $M_{P2}$, when the node $n_3$ is set to the "L" level (=0V), the node $n_4$ is set to $V_{DDL}$. On the other hand, when the node $n_3$ is set to the "H" level (=$V_{DDH}$, 3V), the node $n_4$ is set to $V_{DDH}$-$V_{thn}$ (=2.5V).

The operation of the first embodiment of the level shift circuit according to the present invention will be explained hereinbelow.

When the "H" level signal (=1.5V) is supplied to the input terminal $S_1$, the node $n_1$ is set to the "L" level (=0V) by the inverter $IV_1$. In this case, since the gate of the transistor $M_{N1}$ is at $V_{DDL}$ (=1.5V), the transistor $M_{N1}$ is turned on, so that the node $n_2$ is discharged down to the "L" level (=0). The "L" level of the node $n_2$ is inputted to the inverter $IV_2$, the node $n_3$ changes to the "H" level (=3V), so that the "H" level is outputted to the output terminal $S_2$.

Accordingly, as shown in FIG. 3B, the "H" level input signal having a voltage amplitude of $V_{DDL}$ is level-shifted to the "H" level output signal having a voltage amplitude of $V_{DDH}$, and then outputted from the output terminal $S_2$.

When the node $n_3$ changes to the "H" level (=3V), the NMOS transistor $M_{N2}$ is turned on, while the PMOS transistors $M_{P1}$ and $M_{P2}$ are turned off. As a result, the gate potential (i.e., the node $n_4$) of the transistor $M_{N1}$ is set to $V_{DDH}$-$V_{thn}$ (=2.5V). Therefore, the transistor $M_{N1}$ is kept turned on, so that the node $n_2$ is held at the "L" level and the node $n_3$ is held at the "H" level.

On the other hand, when the "L" level signal (=0V) is supplied to the input terminal $S_1$, the node n is set to the "H" level (=1.5V) by the inverter $IV_1$. At this time, the node $n_3$ is still kept at $V_{DDH}$; the node $n_4$ is kept at $V_{DDH}$-$V_{thn}$ (=2.5V); the NMOS transistor $M_{N1}$ is kept turned on; and the PMOS transistor $M_{P1}$ is kept turned off. As a result, the node $n_2$ is charged up to $V_{DDL}$ (=1.5V) at high speed. Therefore, when the threshold level of the inverter $IV_2$ is set to a value lower than 1.5V, the node $n_3$ can be set to the "L" level (=0V) by the inverter $IV_2$.

Accordingly, as shown in FIG. 3B, the "L" level input signal having a voltage amplitude of GND and supplied to the input terminal $S_1$ is propagated to the output terminal $S_2$ as the "L" level output signal having a voltage amplitude of GND. When the node $n_3$ changes to the "L" level (=0V), the PMOS transistors $M_{P1}$ and $M_{P2}$ are turned on, while the NMOS transistor $M_{N2}$ is turned off. As a result, the gate potential (i.e., the node $n_4$) of the transistor $M_{N1}$ is set to $V_{DDL}$ (=1.5V). Therefore, the transistor $M_{N1}$ is turned off to pull the node $n_2$ up to the "H" level (=3V), and then the node $n_3$ is held at the "L" level. In this case, since the transistor $M_{N1}$ is turned off, the potential at the node $n_1$ is not charged beyond $V_{DDL}$.

In the above-mentioned propagation of the "L" level signal, since the initial input level $V_{DDL}$ to the inverter $IV_2$ is lower than the supply voltage $V_{DDH}$ to the inverter $IV_2$, a dc current somewhat flows through the inverter $IV_2$ at the beginning. However, when the node $n_3$ changes to the "L" level (=0V), the PMOS transistor $M_{P1}$ is turned on, so that the node $n_2$ is soon charged up to $V_{DDL}$ (=3V). The PMOS transistor $M_{P1}$ is then turned off. As a result, since the input level to the inverter $IV_2$ becomes equal to $V_{DDH}$, no dc current flows through the inverter $IV_2$.

In the first embodiment shown in FIG. 3A, when the "H" level (=$V_{DDL}$) signal propagates from the node $n_1$ to the node $n_2$, the delay caused by the transistor $M_{N1}$ can be shortened. Because the gate voltage of the transistor $M_{N1}$ is set to $V_{DDH}$-$V_{thn}$ (=2.5V); that is, the gate voltage higher than the conventional gate voltage (1.5V, FIG. 1A) is applied to the transistor $M_{N1}$ to turn on the transistor $M_{N1}$ deeply.

Further, in the first embodiment, the "H" level (=$V_{DDL}$) signal can be propagated by the transistor $M_{N1}$ from the node $n_1$ to the node $n_2$ without reducing the signal level below the "H" level (=$V_{DDL}$). It is thus possible to set the threshold level of the inverter $IV_2$ at an ordinary level, so that the delay time required for the level shift can be shortened. In other words, even when the $V_{DDL}$ is lowered, the "H" level at the node $n_2$ will not be lowered below the threshold level of the inverter $IV_2$, so that the operation margin can be increased. This is because the "H" level at the node $n_2$ will not be reduced to $V_{DDL}$-$V_{thn}$ (=1.0V) by the transistor $M_{N1}$ as with the case of the circuit of FIG. 1A, that is, the "H" level at the node $n_1$ can be propagated, as it is, to the node $n_2$.

A second embodiment of the semiconductor device according to the present invention will be described hereinbelow with reference to FIGS. 4A and 4B. In the figures, the same reference numerals have been retained for similar parts and voltages having the same function as with the case of the semiconductor device shown in FIGS. 3A and 3B, without repeating the similar description thereof.

In this second embodiment, the transistor $M_{N2}$ is diode-connected; that is, their drain and gate are connected to each other. In this case, since the transistor $M_{N2}$ is turned on only when the "H" level (=$V_{DDH}$) is supplied to its gate, the second embodiment shown in FIG. 4A can operate in the same way as with the case of the first embodiment shown in FIG. 3A. That is, the "H" level input signal having a voltage amplitude of $V_{DDL}$ can be level-shifted to the "H" level output signal having a voltage amplitude of $V_{DDH}$, as shown in FIG. 4B.

Figure 4A:
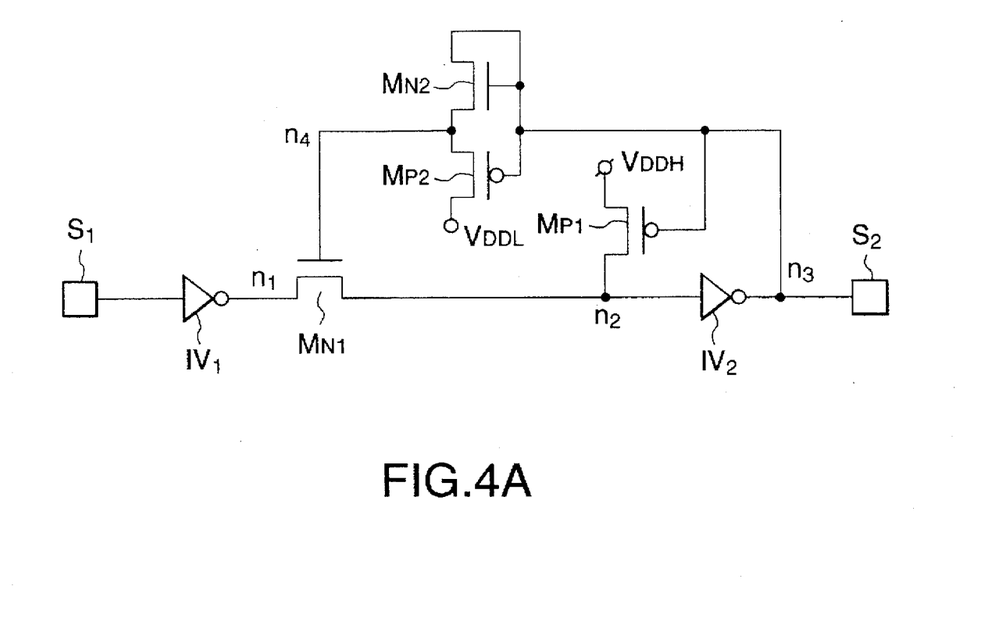
FIG. 4A is a circuit diagram showing a second embodiment of the level shift semiconductor device according to the present invention.
Figure 4B:
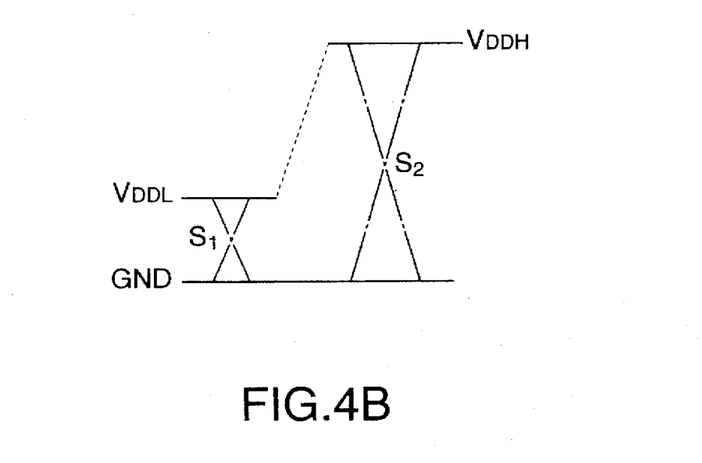
FIG. 4B shows the voltage level change of the semiconductor device shown in FIG. 4A.

Further, when the threshold level $V_{thn}$ of the NMOS transistor $M_{N2}$ shown in FIGS. 3A and 4A is set to a value lower than the ordinary value (e.g., 0.5V), it is possible to set the voltage applied to the gate of the transistor $M_{N1}$ to a higher value. This high gate voltage application to the transistor $M_{N1}$ can be applied in the same way to the threshold level (e.g., -0.5V) of the PMOS transistor $M_{P2}$ of the circuit shown in FIG. 5A and 6A, described later, in which two negative supply voltages are used.

A third embodiment of the semiconductor device according to the present invention will be described hereinbelow with reference to FIGS. 5A and 5B. In the figures, the same reference numerals have been retained for similar parts and voltages having the same function as with the case of the semiconductor device shown in FIGS. 3A and 3B, without repeating the similar description thereof.

In this third embodiment, the level shift circuit shown in FIG. 3A is applied to a negative voltage supply circuit. That is, a voltage $V_{SSH}$ of a smaller absolute value and a voltage $V_{SSL}$ of a larger absolute value are supplied to the circuit. The inverter $IV_1$ is driven between the voltage $V_{SSH}$ and the ground GND, while the inverter $IV_2$ is driven between the voltage $V_{SSL}$ and the ground GND. In correspondence to the operation by the negative supply voltage circuit, the NMOS transistor $M_{N1}$ shown in FIG. 3A is replaced with the PMOS transistor $M_{P1}$ and the PMOS transistor $M_{P1}$ shown in FIG. 3A is replaced with the NMOS transistor $M_{N1}$.

Figure 5A:
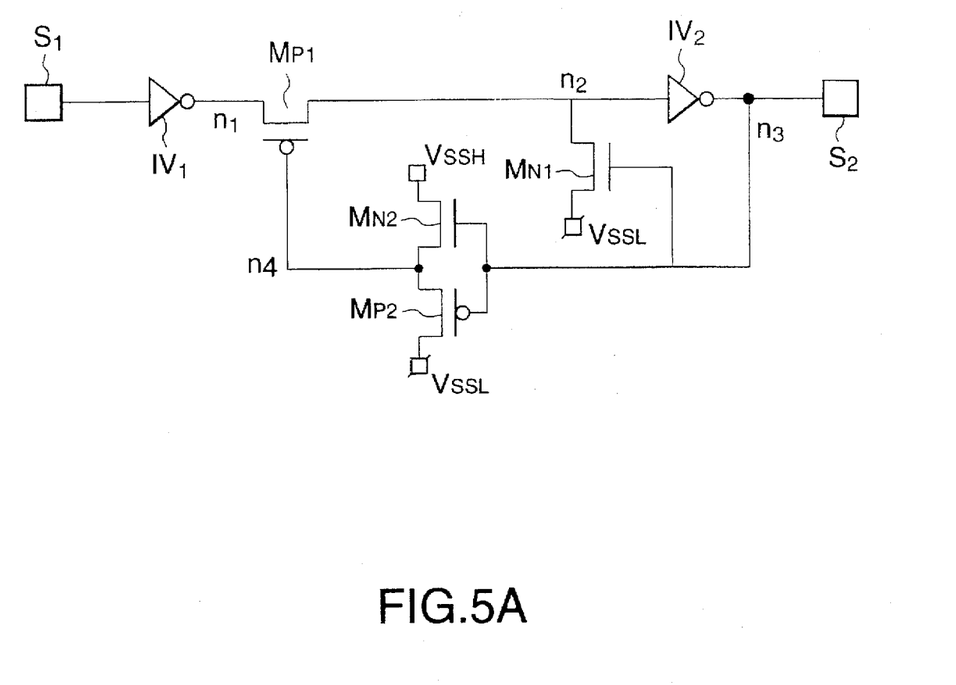
FIG. 5A is a circuit diagram showing a third embodiment of the level shift semiconductor device according to the present invention.
Figure 5B:
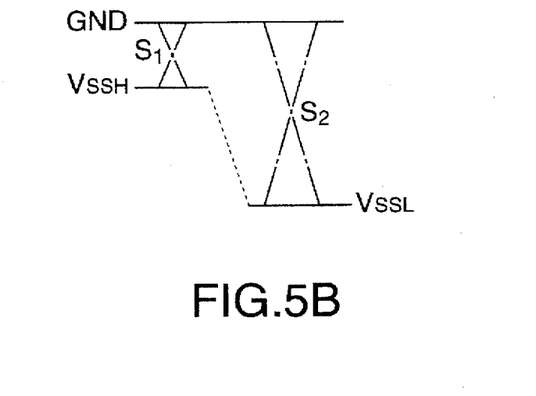
FIG. 5B shows the voltage level change of the semiconductor device shown in FIG. 4B.

In the circuit construction of the negative supply voltage, as shown in FIG. 5B, $V_{DDL}$ shown in FIG. 3B corresponds to $V_{SSH}$, and $V_{DDH}$ shown in FIG. 3B corresponds to $V_{SSL}$. The circuit operation of the third embodiment is the same as with the case of the first embodiment shown in FIG. 3A.

Figure 6A:
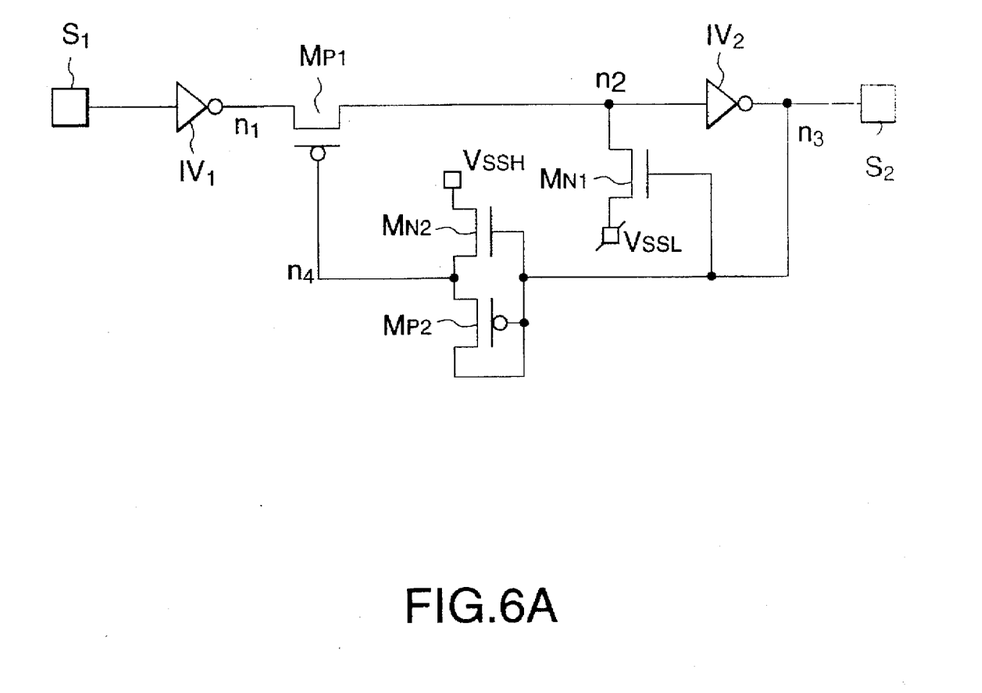
FIG. 6A is a circuit diagram showing a fourth embodiment of the level shift semiconductor device according to the present invention.
Figure 6B:
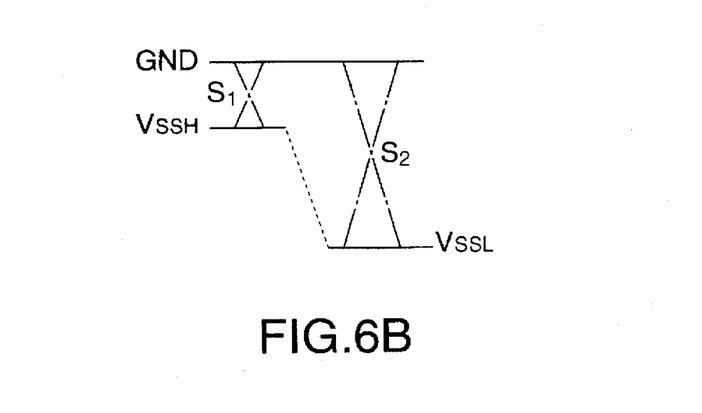
FIG. 6B shows the voltage level change of the semiconductor device shown in FIG. 6A.

A fourth embodiment of the semiconductor device according to the present invention will be described hereinbelow with reference to FIGS. 6A and 6B. In the figures, the same reference numerals have been retained for similar parts and voltages having the same function as with the case of the semiconductor device shown in FIGS. 5A and 5B, without repeating the similar description thereof.

In this fourth embodiment, the transistor $M_{P2}$ of the third embodiment using the negative supply voltage circuit shown in FIG. 5A is diode-connected in the same way as with the case of the second embodiment shown in FIG. 4A. In this circuit construction as shown in FIG. 6A, it is possible to obtain the same operation as with the case of the circuit shown in FIG. 5A.

A fifth embodiment of the semiconductor device according to the present invention will be described hereinbelow with reference to FIGS. 7A and 7B. In the figures, the same reference numerals have been retained for similar parts and voltages having the same function as with the case of the circuit shown in FIG. 1A, without repeating the similar description thereof.

In this embodiment, a bias circuit BC is additionally provided for the circuit shown in FIG. 1A, to have a higher gate bias voltage of the NMOS transistor $M_{N1}$. In more detail, in this embodiment, the gate potential of the NMOS transistor $M_{N1}$ is always kept at $V_{DDL}+V_{thn}$ (=2V) by the bias circuit BC.

Figure 7A:
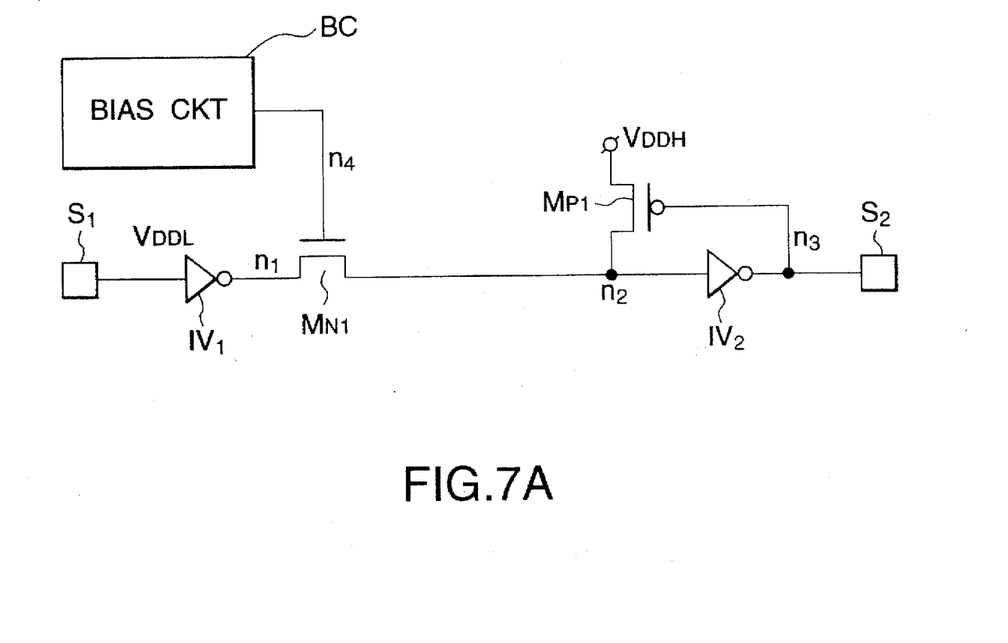
FIG. 7A is a circuit diagram showing a fifth embodiment of the level shift semiconductor device according to the present invention.
Figure 7B:
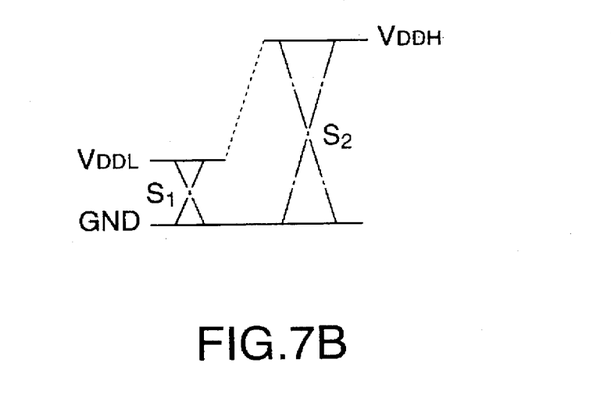
FIG. 7B shows the voltage level change of the semiconductor device shown in FIG. 7A.

In the circuit shown in FIG. 7A, when the "H" level signal (=1.5V) is supplied to the input terminal $S_1$, the node $n_1$ is set to the "L" level (=0V) by the inverter $IV_1$. Here, since $V_{DDL}$ (=2V) is applied to the gate of the NMOS transistor $M_{N1}$, the transistor $M_{N1}$ is turned on to discharge the charge at the node $n_2$, so that the node $n_2$ changes to the "L" level (0V). Therefore, the node $n_3$ changes the "H" level (=3V) by the inverter $IV_2$ having the input at the node $n_2$. As a result, the "H" level input signal having a voltage amplitude of $V_{DDL}$ can be level-shifted to the "H" level output signal having a voltage amplitude of $V_{DDH}$, and then outputted from the output terminal $S_2$, as shown in FIG. 7B. At this time, the PMOS transistor $M_{P1}$ is turned off.

On the other hand, when the "L" level signal (=0V) is supplied to the input terminal $S_1$, the node $n_1$ is set to the "H" level (=1.5V) by the inverter $IV_1$. Here, since $V_{DDL}$ (=2V) is applied to the gate of the NMOS transistor $M_{N1}$, after the node $n_2$ has been charged up to the "H" level (=1.5V), the transistor $M_{N1}$ is turned off. Here, when the threshold level of the inverter $IV_2$ is set to a potential lower than 1.5V, the input to the inverter $IV_2$ changes to the "H" level, and the node $n_3$ changes to the "L" level (=0V). This "L" level is propagated to the output terminal $S_2$ and the gate of the PMOS transistor $M_{P1}$. When the "L" level signal is applied to the gate of the PMOS transistor $M_{P1}$, since the transistor $M_{P1}$ is turned on, the potential at the node $n_2$ is pulled up to $V_{DDL}$ (=3V). The pulled-up potential at the node $n_2$ can prevent the through current from being kept flowing through the inverter $IV_2$ (i.e., the input level status). In this circuit, since the source side of the NMOS transistor $M_{N1}$ is at the node $n_1$ and further since the gate-source voltage is lower than $V_{thn}$, the transistor $M_{N1}$ is kept turned off, so that the potential at the node $n_1$ is not charged beyond $V_{DDL}$.

As described above, since the gate bias voltage of the transistor $M_{N1}$ is set a higher value, the level of the "H" level ($V_{DDL}$) signal will not be lowered at the node $n_1$ and propagated to the node $n_2$ as it is. In other words, since a relatively high "H" level signal can be applied to the inverter $IV_2$, it is possible to obtain the same function as with the case of the circuit shown in FIG. 3A.

Figure 9:
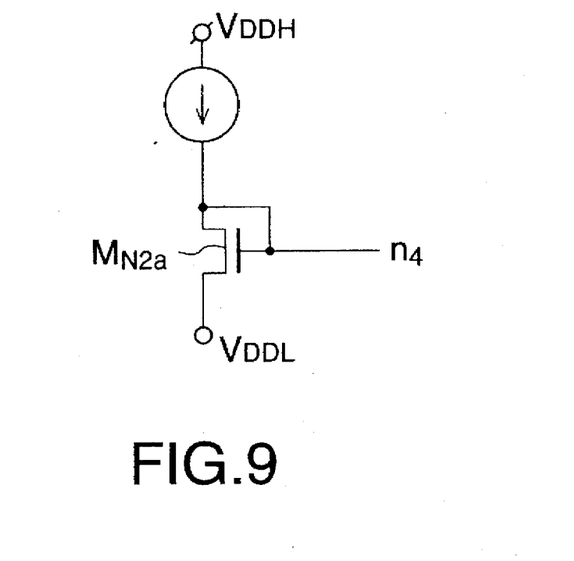
FIG. 9 is a circuit diagram showing an example of the bias circuit shown in FIG. 7A.

FIG. 9 shows an example of the bias circuit BC shown in FIG. 7A. As shown, the bias circuit BC is connected between the supply voltage $V_{DDL}$ and $V_{DDL}$, and consists of a constant current source and a diode-connected NMOS transistor $M_{N2}$. The output voltage of this bias circuit is an addition of the voltage $V_{DDL}$ and a voltage drop $V_{thn}$ between the gate and the source of the transistor $M_{N2}$ as $(V_{DDL}+V_{thn})$.

A sixth embodiment of the semiconductor device according to the present invention will be described hereinbelow with reference to FIGS. 8A and 8B. In this embodiment, the semiconductor device shown in FIG. 7A is applied to a negative voltage supply circuit. That is, the NMOS transistor $M_{N1}$ shown in FIG. 7A is replaced with the PMOS transistor $M_{N1}$, and the PMOS transistor $M_{P1}$ shown in FIG. 7A is replaced with the NMOS transistor $M_{N1}$. Further, the gate potential of the transistor $M_{P1}$ is always biased at $V_{SSh}-|V_{thp}|$.

Figure 8A:
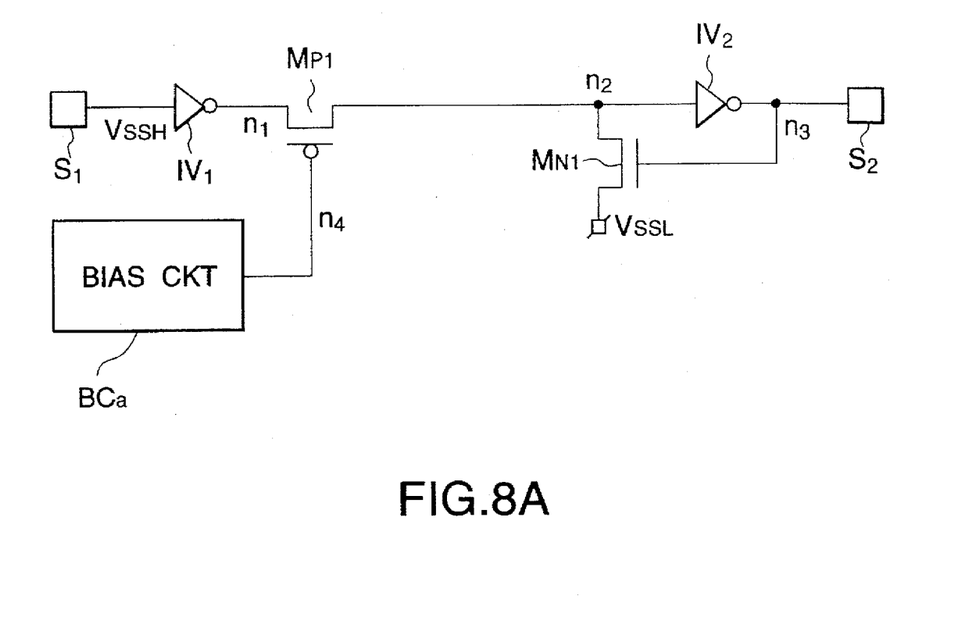
FIG. 8A is a circuit diagram showing a sixth embodiment of the level shift semiconductor device according to the present invention.
Figure 8B:
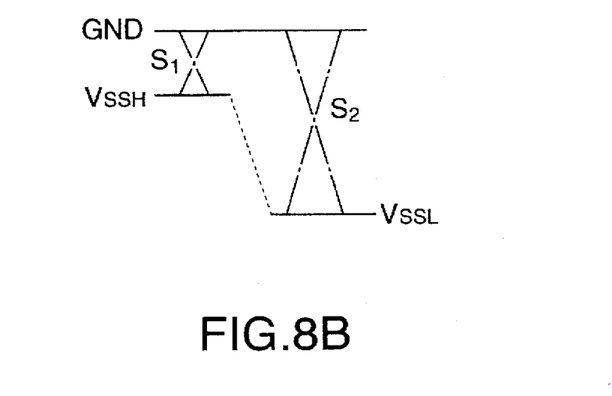
FIG. 8B shows the voltage level change of the semiconductor device shown in FIG. 8A.
Figure 10:
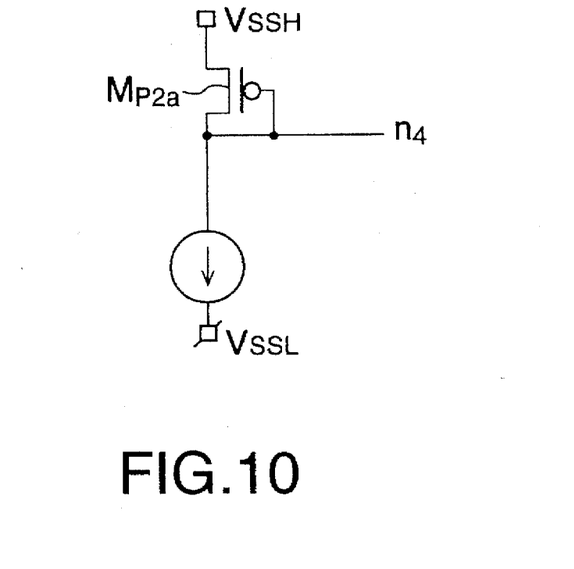
FIG. 10 is a circuit diagram showing another example of the bias circuit shown in FIG. 8A.

FIG. 10 shows an example of a bias circuit BCa shown in FIG. 8A. As shown, the bias circuit BCa is connected between the supply voltage $V_{SSH}$ and $V_{SSL}$, and consists of a constant current source and a diode-connected $PM_{N1}$OS transistor $M_{P2a}$. The output voltage of this bias circuit is an addition of the negative voltage $V_{SSH}$ and a negative voltage drop $V_{thp}$ between the gate and the source of the transistor $M_{P2}$ as $-(V_{SSH}+V_{thp})$.

Figure 11A:
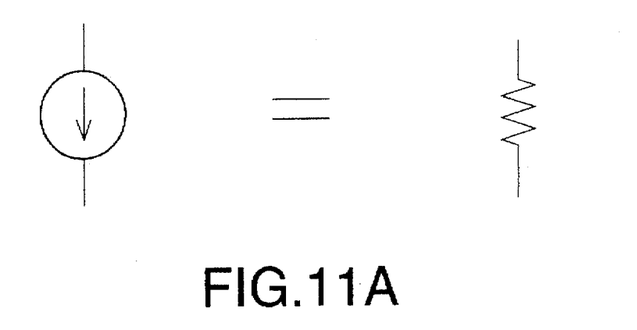
FIGS. 11A, 11B, and 11C are circuit diagrams each showing an example of the current source shown in FIGS. 9 and 10.
Figure 11B:
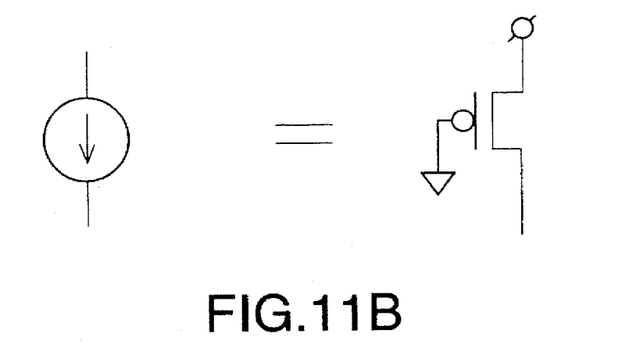
Figure 11C:
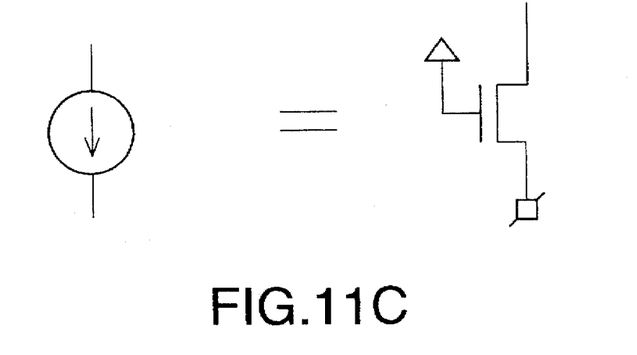

FIGS. 11A to 11C show examples of the constant current source. FIG. 11A shows a constant current source for generating a constant current by a relatively high resistance; FIG. 11B shows a constant current source formed by a fixedly-biased PMOS transistor; and FIG. 11C shows a constant current source formed by a fixedly-biased NMOS transistor.

Further, in the respective embodiments, the inverter $IV_1$ is not necessarily required, but can be replaced with another logical gate which can operate on the basis of the first supply voltage.

As described above, in the level shift semiconductor device according to the present invention, it is possible to achieve a level shift circuit that can shift a signal level to another signal level at a high speed and at a low power loss, while increasing the operation margin.

What is claimed is:

1. A level shift semiconductor device, comprising:
   a first MOS transistor of a first-conductivity type having a source supplied with an input signal;
   an inverter having an input terminal connected to a drain of the first MOS transistor of the first-conductivity type and an output terminal for outputting an output signal;
   a first MOS transistor of a second-conductivity type having a drain connected to the input terminal of the inverter and a gate connected to the output terminal of the inverter, the second conductivity type being opposite of the first conductivity type;
   a second MOS transistor of the first-conductivity type having a gate connected to the output terminal of the inverter and a source connected to a gate of the first MOS transistor of the first-conductivity type;
   a second MOS transistor of the second-conductivity type having a gate connected to the gate of the second MOS transistor of the first-conductivity type and a source connected to the source of the second MOS transistor of the first-conductivity type;
   a first voltage supply for supplying a first supply voltage to a drain of the second MOS transistor of the second-conductivity type; and a second voltage supply for supplying a second voltage to the inverter, a source of the first MOS transistor of the second-conductivity type, and a drain of the second MOS transistor of the first-conductivity type, the second voltage being larger in absolute value than the first voltage.

2. The level shift semiconductor device of claim 1, wherein a threshold value of the second MOS transistor of the first-conductivity type is set to a value smaller than another threshold value of the first MOS transistor of the first-conductivity type.

3. The level shift semiconductor device of claim 1, wherein the first and the second MOS transistors of the first-conductivity type and the first and the second MOS transistors of the second-conductivity type are of enhancement type.

4. A level shift semiconductor device, comprising:

a first-conductivity type MOS transistor having a source supplied with an input signal;

an inverter having an input terminal connected to a drain of the first-conductivity type MOS transistor and an output terminal for outputting an output signal;

a second-conductivity MOS transistor having a drain connected to the input terminal of the inverter and a gate connected to the output terminal of the inverter, the second conductivity type being opposite of the first-conductivity type;

a bias circuit for applying a first voltage obtained by adding a maximum voltage of the input signal and a threshold voltage of the first-conductivity type MOS transistor, to a gate of the first-conductivity type MOS transistor; and a voltage supply for supplying a second voltage to a source of the second-conductivity type MOS transistor and the inverter, the second voltage being larger in absolute value than the maximum voltage of the input signal.

5. The level shift semiconductor device of claim 4, wherein the bias circuit consists of a constant current source and a diode function element connected in series between the maximum voltage of the input signal and second voltage.

6. The level shift semiconductor device of claim 4, wherein the first and the second conductivity-type MOS transistors are of enhancement type.

7. A level shift semiconductor device, comprising:

a first MOS transistor of a first-conductivity type having a source supplied with an input signal;

inverter having an input terminal connected to a drain of the first MOS transistor of the first-conductivity type and an output terminal for outputting an output signal;

a first MOS transistor of a second-conductivity type having a drain connected to the input terminal of the inverter and a gate connected to the output terminal of the inverter, the second conductivity type being opposite of the first conductivity type;

a second MOS transistor of the first-conductivity type having a gate connected to the output terminal of the inverter and a source connected to a gate of the first MOS transistor of the first-conductivity type, wherein a drain and the gate of the second MOS transistor of the first-conductivity type are connected together to the output terminal of the inverter;

a second MOS transistor of the second-conductivity type having a gate connected to the gate of the second MOS transistor of the first conductivity type and a source connected to the source of the second MOS transistor of the first-conductivity type;

a first voltage supply for supplying a first supply voltage to a drain of the second MOS transistor of the second-conductivity type; and a second voltage supply for supplying a second voltage to the inverter and a source of the first MOS transistor of the second-conductivity type, the second voltage being larger in absolute value than the first voltage.

* * * * *